(12) United States Patent
Tsukiyama et al.

(10) Patent No.: US 12,159,856 B2
(45) Date of Patent: Dec. 3, 2024

(54) METHOD FOR MANUFACTURING SEMICONDUCTOR DEVICE

(71) Applicant: Kioxia Corporation, Tokyo (JP)

(72) Inventors: Satoshi Tsukiyama, Yokohama (JP); Hideo Aoki, Yokohama (JP); Tsukasa Konno, Yokohama (JP)

(73) Assignee: Kioxia Corporation, Tokyo (JP)

( * ) Notice: Subject to any disclaimer, the term of this patent is extended or adjusted under 35 U.S.C. 154(b) by 331 days.

(21) Appl. No.: 17/654,092

(22) Filed: Mar. 9, 2022

(65) Prior Publication Data

US 2023/0076668 A1 Mar. 9, 2023

(30) Foreign Application Priority Data

Sep. 9, 2021 (JP) .................. 2021-146718

(51) Int. Cl.
*H01L 23/00* (2006.01)
*H01L 25/10* (2006.01)

(52) U.S. Cl.
CPC .............. *H01L 24/83* (2013.01); *H01L 24/75* (2013.01); *H01L 25/105* (2013.01); *H01L 2224/75984* (2013.01); *H01L 2224/75985* (2013.01); *H01L 2224/75988* (2013.01); *H01L 2224/83203* (2013.01); *H01L 2224/83986* (2013.01); *H01L 2225/06506* (2013.01); *H01L 2225/0651* (2013.01); *H01L 2225/06524* (2013.01); *H01L 2225/06562* (2013.01); *H01L 2225/1052* (2013.01); *H01L 2924/1431* (2013.01); *H01L 2924/1438* (2013.01)

(58) Field of Classification Search
CPC ........... H01L 2224/83203; H01L 21/56; H01L 24/83; H01L 2224/75988; H01L 2225/06506; H01L 2225/06524; H01L 2225/1052; H01L 2924/1431; H01L 2224/75985; H01L 24/75; H01L 25/04; H01L 25/0657; H01L 25/50; H01L 23/3135
See application file for complete search history.

(56) References Cited

U.S. PATENT DOCUMENTS

| | | | |
|---|---|---|---|
| 7,650,688 B2 | 1/2010 | Lee et al. | |
| 2013/0330879 A1 | 12/2013 | Maki et al. | |
| 2021/0300098 A1* | 9/2021 | Moore | G03F 7/0002 |
| 2023/0197479 A1* | 6/2023 | Benkendorfer | H01L 21/67144 438/106 |
| 2024/0038570 A1* | 2/2024 | Purchase | H01L 24/75 |

FOREIGN PATENT DOCUMENTS

JP 2014-165451 A 9/2014

\* cited by examiner

*Primary Examiner* — Thanh Y. Tran
(74) *Attorney, Agent, or Firm* — Oblon, McClelland, Maier & Neustadt, L.L.P.

(57) ABSTRACT

A method for manufacturing a semiconductor device of an embodiment, comprises a step of mounting a first semiconductor element on a board and a step of accommodating a member in which a plate-shaped member and a first adhesive layer are stacked in a collet and pressure-bonding the heated first adhesive layer on the board on which the first semiconductor element is mounted. The collet has a member having the first Young's modulus and a second member having a second Young's modulus which is lower than the first Young's modulus on a surface that accommodates the member in which the plate-shaped member and the first adhesive layer are stacked.

14 Claims, 9 Drawing Sheets

METHOD FOR MANUFACTURING SEMICONDUCTOR DEVICE

CROSS-REFERENCE TO RELATED APPLICATION

This application is based upon and claims the benefit of priority from Japanese Patent Application No. 2021-146718, filed on Sep. 9, 2021, the entire contents of which are incorporated herein by reference.

FIELD

Embodiments described herein relate generally to a method for manufacturing a semiconductor device.

BACKGROUND

In a package of the related art in which NAND flash memory chips are stacked, a collet is used when a controller chip provided on a board is filled with a die attach film (DAF). Since the controller chip is filled by the collet, a portion having the controller chip and a portion not having the controller chip have different stresses, a protrusion portion may be generated in the DAF on the controller chip.

DETAILED DESCRIPTION

A method for manufacturing a semiconductor device of an embodiment, comprises a step of mounting a first semiconductor element on a board and a step of accommodating a member in which a plate-shaped member and a first adhesive layer are stacked in a collet and pressure-bonding the heated first adhesive layer on the board on which the first semiconductor element is mounted. The collet has a first member having a first Young's modulus and a second member having a second Young's modulus which is lower than the first Young's modulus on a surface that accommodates the member in which the plate-shaped member and the first adhesive layer are stacked.

Hereinafter, embodiments will be described with reference to the drawings.

In this specification, several elements are given a plurality of expression examples. These expression examples are merely examples, and do not deny that the above-described elements are expressed by other expressions. An element to which a plurality of expressions are not given may also be expressed by another expression.

The drawings are schematic, and a relationship between a thickness and a plane dimension, a ratio between thicknesses of layers, and the like may be different from actual relationship and ratios. In addition, the drawings may include portions having different dimensional relationships and ratios. In the drawings, some reference numerals are omitted.

In this specification, steps include not only independent steps but also other steps and combinations with other treatments. In numerical conditions in this specification, when a plurality of numerical ranges are described, an upper limit value or a lower limit value of the numerical range may be remounted with an upper limit value or a lower limit value of another numerical range. When the upper limit value and the lower limit value of the numerical condition in this specification are described, the numerical condition may be remounted with a condition of a numerical range in which the upper limit value and the lower limit value are combined.

First Embodiment

Figure 1:
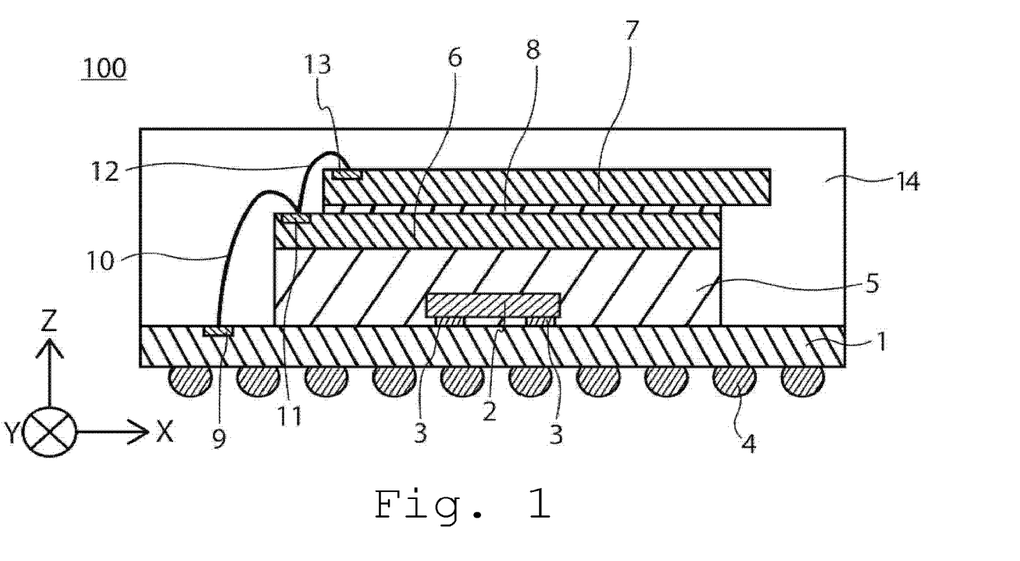
FIG. 1 is a schematic cross-sectional view of a semiconductor device according to an embodiment.

A first embodiment relates to a method for manufacturing a semiconductor device. FIG. 1 is a schematic cross-sectional view of a semiconductor device 100. More specifically, the semiconductor device 100 according to the embodiment is a semiconductor package on which a NAND flash memory chip or the like is mounted. It is preferable that an X direction, a Y direction, and a Z direction intersect each other and are orthogonal to each other.

The semiconductor device 100 is an example of a storage device. The semiconductor device 100 includes a board 1, a first semiconductor element 2, conductive bonding agents 3, solder balls 4, a first resin layer 5, a plate-shaped member 6, a second semiconductor element 7, a second resin layer 8, a pad 9, a bonding wire 10, a pad 11, a bonding wire 12, a pad 13, and a sealing material 14.

The board 1 is a support board of the first semiconductor element 2 or the like. More specifically, the board 1 is a multilayer wiring board. The first semiconductor element 2 is provided on a first surface side of the board 1. On a second surface side facing the first surface of the board 1, hemispherical electrodes such as the solder balls 4 for connecting to an outside of the semiconductor device 100 are provided. The board 1 of FIG. 1 includes one pad 9. The semiconductor device 100 can include a plurality of pads 9.

The first semiconductor element 2 is mounted on the board 1. The first semiconductor element 2 is, for example, a flip chip. The first semiconductor element 2 is covered with the first resin layer 5. The first semiconductor element 2 is connected to the board 1 via the conductive bonding agents 3. When the semiconductor device 100 is the storage device, the first semiconductor element 2 is, for example, a controller chip, and the second semiconductor element 7 is a semiconductor memory chip. The controller chip is a semiconductor chip that controls reading, writing, erasing, and the like of the semiconductor memory chip. The first semiconductor element 2 is positioned not only at a position illustrated in FIG. 1 but also at a location overlapping the plate-shaped member 6 in a stacking direction of the plate-shaped member 6 and the first resin layer 5, and is sealed by the first resin layer 5.

The first semiconductor element 2 is a member having a smaller area than the plate-shaped member 6. For example, an area of a surface of the first semiconductor element 2 facing the plate-shaped member 6 is equal to or more than 13% and equal to or less than 27% of an area of a surface of the plate-shaped member 6 facing the first semiconductor element 2.

The conductive bonding agents 3 electrically connect the first semiconductor element 2 and the board 1. The conductive bonding agents 3 are, for example, solders. The conductive bonding agents 3 are connected to pads on the board 1 (not illustrated in FIG. 1). When the first semiconductor element 2 is not the flip chip, the first semiconductor element 2 can be connected to the board 1 via a bonding wire (not illustrated in FIG. 1).

The solder balls 4 are terminals electrically connected to the outside of the semiconductor device 100. A plurality of solder balls 4 are provided on the semiconductor device 100.

The first resin layer 5 is an insulating resin layer provided between the board 1 and the plate-shaped member 6 and between the first semiconductor element 2 and the plate-shaped member 6. It is preferable that the first resin layer 5 is also provided between the board 1 and the first semiconductor element 2. The first resin layer 5 is stacked on the board 1. It is preferable that the first resin layer 5 is also provided between the board 1 and the first semiconductor element 2 without a gap (void). The first resin layer 5 contains, for example, epoxy resin. The first resin layer 5 is, for example, a layer obtained by curing a first adhesive layer 5A. More specifically, for example, the first resin layer 5 is obtained by curing a die bond adhesive layer of a DAF attached to the plate-shaped member 6. A thickness of the first resin layer 5 is preferably equal to or more than 70 [μm] and equal to or less than 200 [μm]. When the thickness of the first resin layer 5 is small, the sealing of the first semiconductor element 2 may be insufficient. When the thickness of the first resin layer 5 is too thick, a package height of the semiconductor device 100 increases. Thus, the thickness of the first resin layer 5 is more preferably equal to or more than 80 [μm] and equal to or less than 140 [μm], and still more preferably equal to or more than 1.1 times and equal to or less than 2.0 times of a distance from the surface of the first semiconductor element 2 facing the plate-shaped member 6 to the board 1.

The plate-shaped member 6 is provided on the first resin layer 5. The plate-shaped member 6 is a Si layer, an insulating layer, or a third semiconductor element. The first resin layer 5 is sandwiched between the plate-shaped member 6 and the board 1. The semiconductor device 100 of FIG. 1 is in a form in which the plate-shaped member 6 is the third semiconductor element. The third semiconductor element is, for example, a semiconductor memory chip. The plate-shaped member 6 which is the third semiconductor element has the pad 11. The pad 11 is connected to the board 1 via the bonding wire 10. Although the pad 11 and the bonding wire 10 are illustrated as one pad 11 and one bonding wire 10 in FIG. 1, the semiconductor device 100 may include a plurality of pads 11 and a plurality of bonding wires 10.

The second semiconductor element 7 is provided on the plate-shaped member 6 with the second resin layer 8 interposed therebetween. The second semiconductor element 7 is, for example, a semiconductor memory chip. The second semiconductor element 7 has the pad 13. The pad 13 is electrically connected to the pad 11 of the plate-shaped member 6 via the bonding wire 12. The semiconductor memory chip is a semiconductor chip that reads and writes data. A NAND memory chip, a phase change memory chip, a resistance change memory chip, a ferroelectric memory chip, a magnetic memory chip, or the like can be used as a nonvolatile memory chip. A dynamic random access memory (DRAM) or the like can be used as a volatile memory chip. It is preferable that the semiconductor memory chips included in the semiconductor device 100 such as the second semiconductor element 7 and the third semiconductor element of the plate-shaped member 6 are semiconductor chips having the same circuit and the same structure except for individual differences. In the present embodiment, the nonvolatile memory chip or the volatile memory chip can be used as the semiconductor memory chip. The number of stages in which the semiconductor memory chips are stacked while being shifted in the X direction can be not only two as illustrated in FIG. 1 but also three or more.

As illustrated in FIG. 1, when two or more semiconductor memory chips are included, it is preferable that the semiconductor memory chips are stacked in the Z direction while being shifted in the X direction.

In the second resin layer 8 and the first resin layer 5 which is the insulating resin layer provided between the plate-shaped member 6 and the second semiconductor element 7 contain, for example, epoxy resin. The second resin layer 8 is formed by curing, for example, a second adhesive layer 8A. More specifically, for example, the second resin layer 8 is obtained by curing a die bond adhesive layer of a DAF attached to the second semiconductor element 7. When irregularities of the plate-shaped member 6 are large, the irregularities of the plate-shaped member 6 are filled by forming the second resin layer 8 so as to be relatively thick, but since the plate-shaped member 6 according to the embodiment has high flatness, the second semiconductor element 7 is easily mounted even though a thickness of the second resin layer 8 is reduced. The thickness of the second resin layer 8 is reduced, and thus, the package height of the semiconductor device 100 can be reduced. Thus, the thickness of the second resin layer 8 is preferably equal to or more than 3 [μm] and equal to or less than 10 [μm]. Since the thickness of the second resin layer 8 can be reduced even with respect to the second semiconductor element 7 having a large thickness, the thickness of the second resin layer 8 is more preferably equal to or more than 0.06 times and equal to or less than 0.34 times of the thickness of the second semiconductor element 7. In the embodiment, since the thickness of the second resin layer 8 can be reduced, the thickness of the second resin layer 8 is preferably equal to or more than 0.015 times and equal to or less than 0.143 times of the thickness of the first resin layer 5.

The sealing material 14 seals the first semiconductor element 2, the plate-shaped member 6, and the second semiconductor element 7 provided on the first surface side of the board 1. The sealing material 14 is, for example, mold resin.

Figure 2:
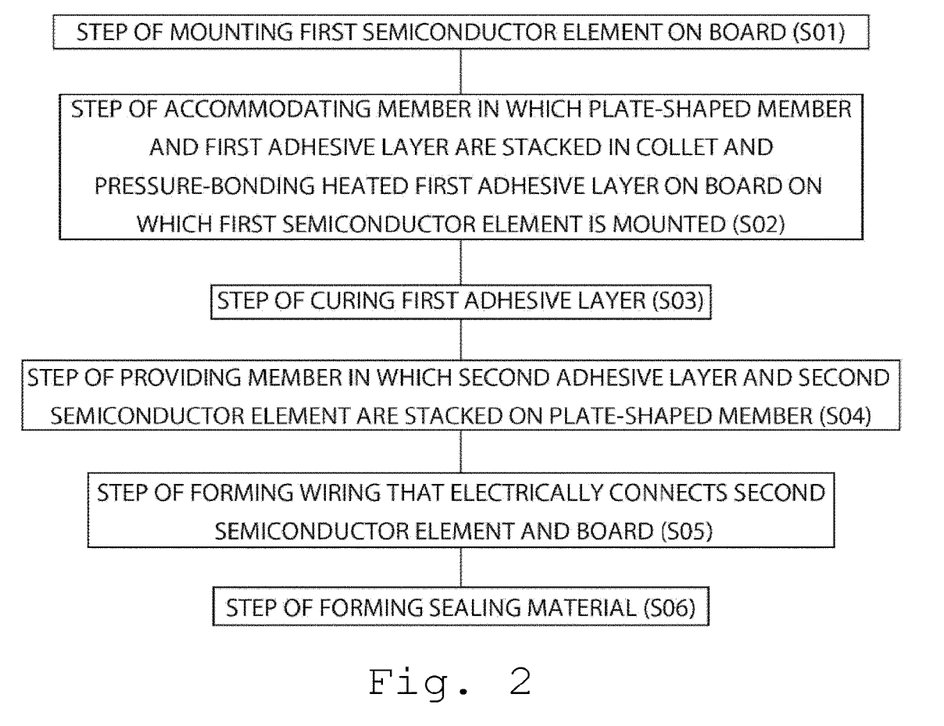
FIG. 2 is a flowchart of a method for manufacturing a semiconductor device according to an embodiment.

Next, a method for manufacturing the semiconductor device 100 will be described. The method for manufacturing the semiconductor device 100 illustrated in the flowchart of the method for manufacturing the semiconductor device 100 of FIG. 2 includes a step (S01) of mounting the first semiconductor element 2 on the board 1, a step (S02) of accommodating a member in which the plate-shaped member 6 and the first adhesive layer 5A are stacked in a collet 20 and pressure-bonding the heated first adhesive layer 5A onto the board 1 on which the first semiconductor element 2 is mounted, a step (S03) of curing the first adhesive layer 5A, a step (S04) of providing a member in which the second adhesive layer 8A and the second semiconductor element 7 are stacked on the plate-shaped member 6, a step (S05) of forming a wiring that electrically connects the second semiconductor element 7 and the board 1, and a step (S06) of forming the sealing material 14.

Figure 3:
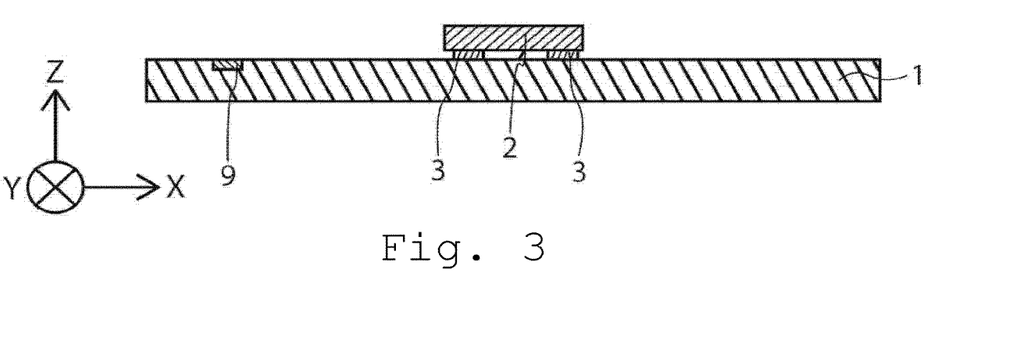
FIG. 3 is a process schematic cross-sectional view of the method for manufacturing a semiconductor device according to the embodiment.

The step (S01) of mounting the first semiconductor element 2 on the board 1 will be described with reference to a step cross-sectional view of FIG. 3. In the step cross-sectional view of FIG. 3, the first semiconductor element 2 is mounted on the board 1. First, the first semiconductor element 2 is mounted on the first surface of the board 1, and the board 1 and the first semiconductor element 2 are electrically connected by the conductive bonding agents 3. When the first semiconductor element 2 is not the flip chip, for example, the bonding wire (not illustrated) is formed to electrically connect the first semiconductor element 2 and the board 1.

Figure 4:
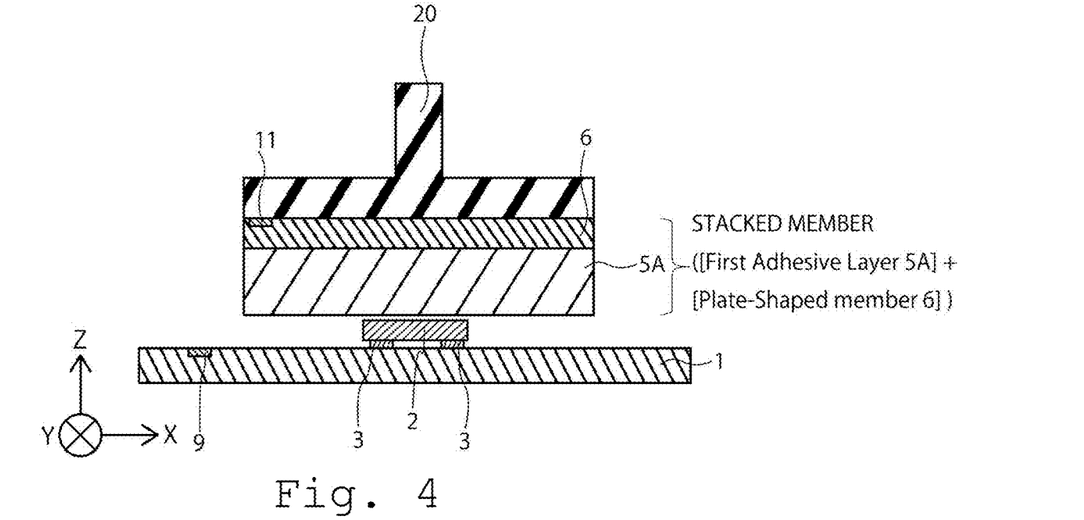
FIG. 4 is a process schematic cross-sectional view of the method for manufacturing a semiconductor device according to the embodiment.

The step (S02) of accommodating the member in which the plate-shaped member 6 and the first adhesive layer 5A are stacked in the collet 20 and pressure-bonding the heated first adhesive layer 5A onto the board 1 on which the first semiconductor element 2 is mounted will be described with reference to a step cross-sectional view of FIG. 4. The step cross-sectional view of FIG. 4 illustrates the member in which the board 1 above which the first semiconductor element 2 is mounted, the plate-shaped member 6 accommodated in the collet 20, and the first adhesive layer 5A are stacked. For example, the plate-shaped member 6 cut out from a wafer to which the DAF is attached and divided is adsorbed by the collet 20, and the member in which the plate-shaped member 6 and the first adhesive layer 5A are stacked from a film of the DAF is accommodated in the collet 20. The collet 20 that accommodates the member in which the plate-shaped member 6 and the first adhesive layer 5A are stacked is moved above the first semiconductor element 2, and a surface of the first adhesive layer 5A is pressed against and pressure-bonded to the board 1 and the first semiconductor element 2.

The first adhesive layer 5A and the second adhesive layer 8A are, for example, die bond adhesive layers of the DAF. The first adhesive layer 5A and the second adhesive layer 8A are the first resin layer 5 and the second resin layer 8 before curing, respectively. The first adhesive layer 5A and the second resin layer 8A contain epoxy resin.

At the time of the pressure-bonding, the first adhesive layer 5A is heated such that the first adhesive layer 5A is easily deformed. The first adhesive layer 5A is heated by heating the collet 20 or directly heating the first adhesive layer 5A. When the first adhesive layer 5A is cured at the time of pressure-bonding the first adhesive layer 5A, since a pressure-bonding failure may be caused, it is preferable that the first adhesive layer 5A is not cured at the time of the pressure-bonding. In order to lower a viscosity of the first adhesive layer 5A, a temperature of the first adhesive layer 5A at the time of the pressure-bonding is preferably equal to or more than 50 [° C.] and equal to or less than 150 [° C.]. When the temperature of the first adhesive layer 5A is lower than 50 [° C.], it is difficult to lower the viscosity of the first adhesive layer 5A, and it is difficult to suitably seal the first semiconductor element 2. When the temperature of the first adhesive layer 5A is higher than 150 [° C.], the viscosity of the first adhesive layer 5A is excessively lowered, a bleed easily occurs, or the first adhesive layer 5A is easily cured. Thus, the temperature of the first adhesive layer 5A at the time of the pressure-bonding is more preferably equal to or more than 70 [° C.] and equal to or less than 130 [° C.].

A pressure-bonding time is preferably equal to or more than 0.5 [seconds] and equal to or less than 5.0 [seconds]. In order to prevent the curing of the first adhesive layer 5A during the pressure-bonding, a time from when the first adhesive layer 5A is heated to when the pressure-bonding is completed is preferably equal to or less than 10.0 [seconds]. When the pressure-bonding time is too short, the pressure-bonding becomes insufficient, the sealing of the first semiconductor element 2 becomes insufficient, or it is easy to form a protrusion shape along the shape of the first semiconductor element 2 on the first adhesive layer 5A and the plate-shaped member 6. Thus, the pressure-bonding time is more preferably equal to or more than 1.5 [seconds] and equal to or less than 3.0 [seconds].

A pressure applied to the board 1 on which the first semiconductor element 2 is mounted by the collet 20 that accommodates the plate-shaped member 6 and the first adhesive layer 5A at the time of the pressure-bonding is preferably equal to or more than $5 \times 10^4$ [Pa] and equal to or less than $5 \times 10^5$ [Pa]. When the pressure is too low, the pressure-bonding tends to be insufficient. When the pressure is too high, the bleed may easily occur. Thus, the pressure applied to the board 1 on which the first semiconductor element 2 is mounted by the collet 20 that accommodates the plate-shaped member 6 and the first adhesive layer 5A at the time of the pressure-bonding is more preferably equal to or more than $1 \times 10^5$ [Pa] and equal to or less than $3 \times 10^5$ [Pa].

Figure 5:
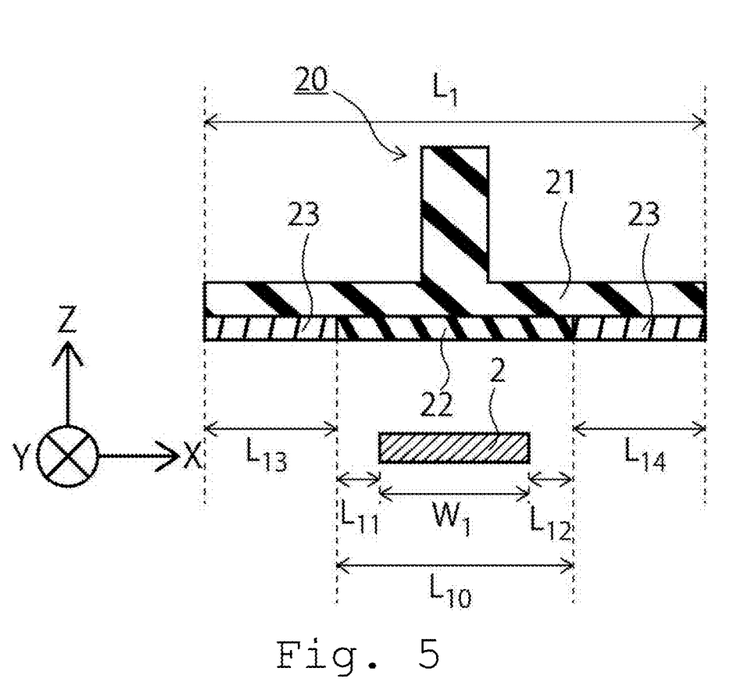
FIG. 5 is a schematic cross-sectional view illustrating a positional relationship between a collet and a first semiconductor element according to the embodiment.
Figure 6:
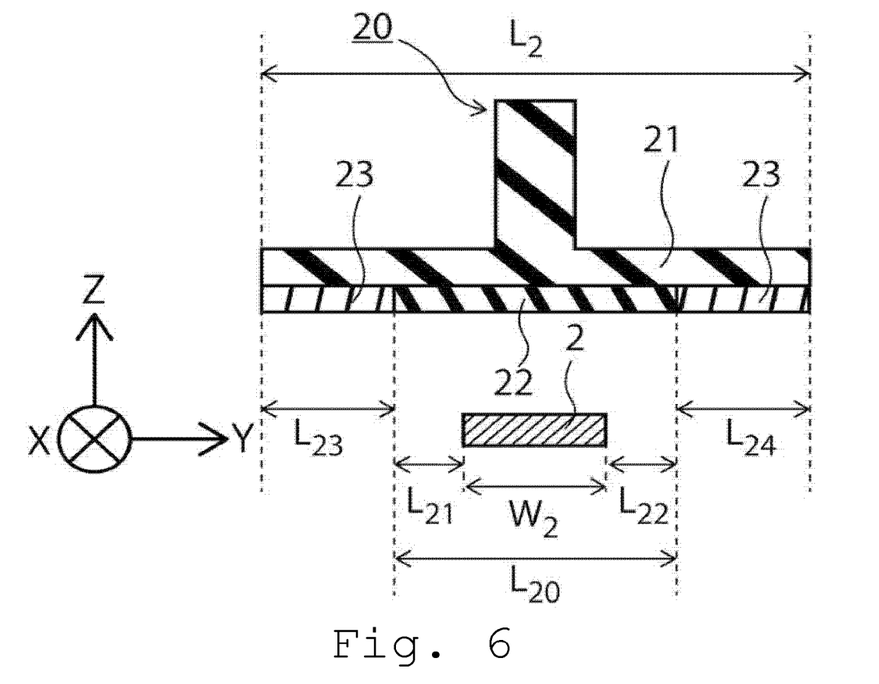
FIG. 6 is a schematic cross-sectional view illustrating the positional relationship between the collet and the first semiconductor element according to the embodiment.

FIGS. 5 and 6 are schematic cross-sectional views illustrating a positional relationship between the collet 20 and the first semiconductor element 2 according to the embodiment. A surface of the collet 20 that accommodates the member in which the plate-shaped member 6 and the first adhesive layer 5A are stacked includes a first member 22 having a first Young's modulus and a second member 23 having a second Young's modulus which is lower than the first Young's modulus. The second member 23 having the second Young's modulus is provided on an outer periphery of the first member 22.

In the pressure-bonding step (S02), a surface of the first member 22 facing the first semiconductor element 2 and a surface of the first semiconductor element 2 facing the first member 22 overlap each other in the Z direction which is a pressure-bonding direction of the board 1 and the first adhesive layer 5A. It is preferable that the surface of the first member 22 facing the first semiconductor element 2 is wider than the surface of the first semiconductor element 2 facing the first member 22. In the pressure-bonding step (S02), it is preferable that the entire surface of the first member 22 facing the first semiconductor element 2 and the entire surface of the first semiconductor element 2 facing the first member 22 overlap each other in the Z direction which is the pressure-bonding direction of the board 1 and the first adhesive layer 5A. Since it is preferable that a surface on which the first semiconductor element 2 is present is pressed by the first member 22 and a surface of the board 1 on which the first semiconductor element 2 is not present is pressed by the second member 23, the entire surface of the first member 22 facing the first semiconductor element 2 and the entire surface of the first semiconductor element 2 facing the first member 22 overlap in the Z direction which is the pressure-bonding direction of the board 1 and the first adhesive layer 5A, and an area of the surface of the first member 22 facing the first semiconductor element 2 is preferably equal to or more than 90% and equal to or less than 110%, and more preferably equal to or more than 99% and equal to or less than 101% of an area of the surface of the first semiconductor element 2 facing the first member 22.

Figure 7:
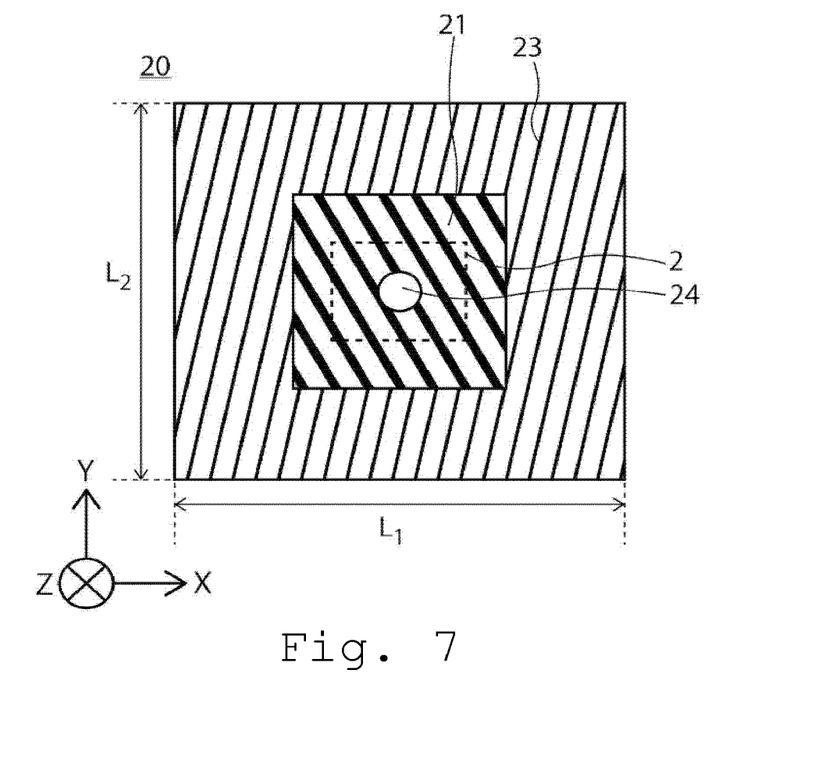
FIG. 7 is a schematic view of a surface that accommodates a member in which a plate-shaped member and a first adhesive layer of the collet according to the embodiment are stacked.

The collet 20 of FIG. 5 illustrates a cross section of the collet 20 in the same direction as the step cross-sectional view of FIG. 4. A cross-sectional view of the collet 20 in a direction perpendicular to a cross-sectional direction of FIG. 5 is a cross-sectional view of FIG. 6. FIG. 7 is a schematic view of the surface of the collet 20 that accommodates the member in which the plate-shaped member 6 and the first adhesive layer 5A are stacked. The surface of the collet 20 that accommodates the member in which the plate-shaped member 6 and the first adhesive layer 5A are stacked is a rectangle having a length $L_1$ in the X direction and a length $L_2$ in the Y direction. The lengths of $L_1$ and $L_2$ are selected according to the shape of the plate-shaped member 6.

The first member 22 and the second member 23 are provided in a collet holder 21. It is preferable that the collet holder 21 is made of a member having high rigidity such as metal or ceramic. Holes communicating with the holes 24 and 25 are provided in the collet holder 21, a negative pressure is applied to the holes 24 and 25 through the holes of the collet holder 21, and the member in which the plate-shaped member 6 and the first adhesive layer 5A are stacked is adsorbed onto and accommodated in a surface on which the first member 22 and the second member 23 are provided.

The first member 22 is a single layer or a multilayer. It is preferable that the first member 22 is, for example, one kind of plate selected from the group consisting of a metal plate, a ceramic plate, and a rubber plate including a filler, or a stacked plate containing one or more kinds thereof. It is preferable that the filler is metal particles or/and ceramic particles. It is preferable that the filler is, for example, one or more kinds selected from the group consisting of silver particles, gold particles, alumina, and silica. Since rubber alone does not have a sufficiently high Young's modulus, the filler is used to increase the Young's modulus. A particle size of the filler is preferably equal to or more than 5 [μm] and equal to or less than 100 [μm]. A filling rate of the filler of the rubber including the filler is preferably equal to or more than 50 [Vol %] and equal to or less than 95 [Vol %]. It is preferable that the rubber plate including the filler is, for example, natural rubber or synthetic rubber including the filler. Examples of the synthetic rubber are one or more kinds selected from the group consisting of butyl rubber, styrene-butadiene rubber, isoprene rubber, ethylene propylene rubber, ethylene-propylene-diene rubber, urethane rubber, silicone rubber, fluororubber, and the like.

The Young's modulus (the first Young's modulus) of the first member 22 is preferably equal to or more than $2 \times 10^9$ [Pa] and equal to or less than $2 \times 10^{10}$ [Pa] in the range of 50 [° C.] or more to 150 [° C.] or less and is more preferably equal to or more than $10 \times 10^9$ [Pa] and equal to or less than $15 \times 10^9$ [Pa] in the range of 50 [° C.] or more to 150 [° C.] or less. The Young's modulus of the first member 22 is determined by performing DMA measurement (dynamic viscoelasticity measurement). It is preferable that the first member 22 has a high thermal conductivity. When the thermal conductivity of the first member 22 is high, the first adhesive layer 5A immediately below the first member 22 is easily heated. The softening of an outer peripheral portion of the first adhesive layer 5A is suppressed at the time of the pressure-bonding by position-selectively heating the first adhesive layer 5A immediately below the first member 22, and thus, the occurrence of the bleed is suppressed. It is preferable that the first adhesive layer 5A abutting on an upper surface of the first semiconductor element 2 at the time of the pressure-bonding is easily deformed along the outer periphery of the first semiconductor element 2 by position-selectively heating the first adhesive layer 5A immediately below the first member 22, and thus, the flatness of the first adhesive layer 5A on the first semiconductor element 2 is increased. Thus, the thermal conductivity of the first member 22 is more preferably equal to or more than 1 [W/mK] and equal to or less than 100 [W/mK].

It is preferable that the second member 23 is, for example, a rubber plate. The second member 23 is a single layer or a multilayer. It is preferable that the rubber plate of the second member 23 is a rubber plate of natural rubber, synthetic rubber, or the like. Examples of the synthetic rubber are one or more kinds selected from the group consisting of butyl rubber, styrene-butadiene rubber, isoprene rubber, ethylene propylene rubber, ethylene-propylene-diene rubber, urethane rubber, silicone rubber, fluororubber, and the like. The filler can also be used at a low filling rate for the second member 23. The filling rate of the filler of the second member 23 is preferably equal to or more than 0.0 [Vol %] and equal to or less than 3.0 [Vol %].

The Young's modulus (the second Young's modulus) of the second member 23 is preferably equal to or more than $1 \times 10^7$ [Pa] and equal to or less than $2 \times 10^9$ [Pa] in the range of 50 [° C.] or more to 150 [° C.] or less, and is more preferably equal to or more than $2 \times 10^6$ [Pa] and equal to or less than $1 \times 10^7$ [Pa] in the range of 50 [° C.] or more to 150 [° C.] or less. The Young's modulus of the first member 22 is determined by performing DMA measurement (dynamic viscoelasticity measurement). It is preferable that the second member 23 preferably has a low thermal conductivity. When the thermal conductivity of the second member 23 is low, it is difficult to heat the first adhesive layer 5A immediately below the second member 23. The softening of the outer peripheral portion of the first adhesive layer 5A is suppressed at the time of the pressure-bonding by not position-selectively heating the first adhesive layer 5A immediately below the second member 23, and thus, the occurrence of the bleed is suppressed. Thus, the thermal conductivity of the second member 23 is more preferably equal to or more than 0.1 [W/mK] and equal to or less than 0.3 [W/mK].

The first Young's modulus of the first member 22 is preferably equal to or more than 100 times and equal to or less than 20,000 times of the second Young's modulus of the second member 23 in the range of 50 [° C.] or more to 150 [° C.] or less, and is more preferably equal to or more than 200 times and equal to or less than 7500 times in the range of 50 [° C.] or more to 150 [° C.] or less. Since a difference in the Young's modulus at the time of the pressure-bonding is large, the flatness of the plate-shaped member 6 after the pressure-bonding is increased, and the amount of bleed of the first adhesive layer 5A can be reduced.

The thermal conductivity of the first member 22 is preferably equal to or more than 3.3 times and equal to or less than 1000 times of the thermal conductivity of the second member 23, and is more preferably equal to or more than 3.3 times and equal to or less than 34 times. Since a difference in the thermal conductivity is large, the flatness of the plate-shaped member 6 after the pressure-bonding is increased, and the amount of bleed of the first adhesive layer 5A can be reduced.

From the viewpoint of pressure-bonding the entire surface of the first semiconductor element 2 by the first member 22 at a high pressure, it is preferable that a width of the first semiconductor element 2 is narrower than a width of the first member 22. More specifically, it is preferable that a width $W_1$ in the X direction is narrower than a width $L_1$ of the first member 22 in the X direction, and it is preferable that a width $W_2$ in the Y direction is narrower than a width $L_2$ of the first member 22 in the Y direction. When the first semiconductor element 2 and the collet 20 overlap in the Z direction which is the pressure-bonding direction of the board 1 and the first adhesive layer 5A, distances ($L_{11}$, $L_{12}$, $L_{21}$, and $L_{22}$ in FIGS. 5 and 6) from a boundary between the first member 22 and the second member 23 to the first semiconductor element 2 are preferably equal to or more than 10 [μm] and equal to or less than 100 [μm]. The pressure-bonding direction of the board 1 and the first adhesive layer 5A is also the stacking direction of the board 1 and the first resin layer 5. When the first semiconductor element 2 and the collet 20 overlap in the Z direction which is the pressure-bonding direction of the board 1 and the first adhesive layer 5A, and when the distances from the boundary between the first member 22 and the second member 23 to the first semiconductor element 2 is too short, the first adhesive layer 5A is easily swelled toward the second member 23 side having low Young's modulus in the vicinity of the boundary between the first member 22 and the second member 23 at the time of the pressure-bonding, and protrusion-shaped swells are easily formed.

Distances ($L_{13}$, $L_{14}$, $L_{23}$, and $L_{24}$ in FIGS. 5 and 6) from an outer periphery of the second member 23 to the boundary between the first member 22 and the second member 23 is preferably equal to or more than 100 [μm] and equal to or less than 50,000 [μm]. The outer periphery of the second member 23 is also an outer periphery of the collet 20, and when the distances from the outer periphery of the second member 23 to the boundary between the first member 22 and the second member 23 are too short, the bleed tends to increase.

When the entire surface that accommodates the member in which the plate-shaped member 6 and the first adhesive layer 5A are stacked is formed by the first member 22 the first adhesive layer 5A partially pushed out by the first semiconductor element 2 at the time of the pressure-bonding is moved to the side surface, and the bleed tends to increase. When the second member 23 is provided on the outer periphery of the first member 22, the first adhesive layer 5A partially pushed out by the first semiconductor element 2 at the time of the pressure-bonding deforms the second member 23, and the first adhesive layer 5A can move to the deformed region. By doing this, the first adhesive layer 5A below the second member 23 is swelled in a protrusion shape, but a part of the first adhesive layer 5A also moves to the side surface. Thus, since the first adhesive layer 5A pushed out by the pressure-bonding of the first semiconductor element 2 is divided into the first adhesive layer 5A that becomes the bleed and the first adhesive layer 5A swelled in a protrusion shape, both the amount of bleed and the height of the first adhesive layer swelled in the protrusion shape can be suppressed.

Since the board 1 and the first semiconductor element 2 have high Young's modulus, a repulsive force when the first adhesive layer 5A is pressed is strong. In particular, a certain portion of the first semiconductor element 2 protruding greatly to the surface of the board 1 has a strong repulsive force. Pressure-bonding with good flatness can be performed by pressing a region having a strong repulsive force by the first member 22.

When the first adhesive layer 5A protrudes in the protrusion shape, the plate-shaped member 6 is also deformed in accordance with a swelled shape of the first adhesive layer 5A. The flatness of the plate-shaped member 6 is better as the amount of deformation of the plate-shaped member 6 is smaller. When the plate-shaped member 6 is deformed, since the second semiconductor element 7 provided on the plate-shaped member 6 is formed on a surface having poor flatness, the second semiconductor element 7 is easily bent or obliquely formed. When the second adhesive layer 8A is thick, it is easy to eliminate the low flatness of the plate-shaped member 6, but when the second adhesive layer 8A is thick, the package of the semiconductor device 100 becomes high. In the embodiment, since the second semiconductor element 7 can be formed on the plate-shaped member 6 having good flatness, the semiconductor device 100 is easily manufactured, and the thickness of the second adhesive layer 8A can be reduced. Thus, a package height of the semiconductor device 100 is reduced.

As illustrated in the schematic view of FIG. 7, a hole 24 is provided in the surface of the collet 20 that accommodates the member in which the plate-shaped member 6 and the first adhesive layer 5A are stacked. In FIG. 7, the hole 24 is provided at a center of the first member 22 and at a center of the surface of the collet 20 that accommodates the member in which the plate-shaped member 6 and the first adhesive layer 5A are stacked. The hole 24 penetrates the first member 22. The hole 24 is a nozzle of the collet 20, and can adsorb and accommodate the member in which the plate-shaped member 6 and the first adhesive layer 5A are stacked on the surface that accommodates the member in which the plate-shaped member 6 and the first adhesive layer 5A are stacked by lowering an atmospheric pressure in the hole 24.

Figure 8:
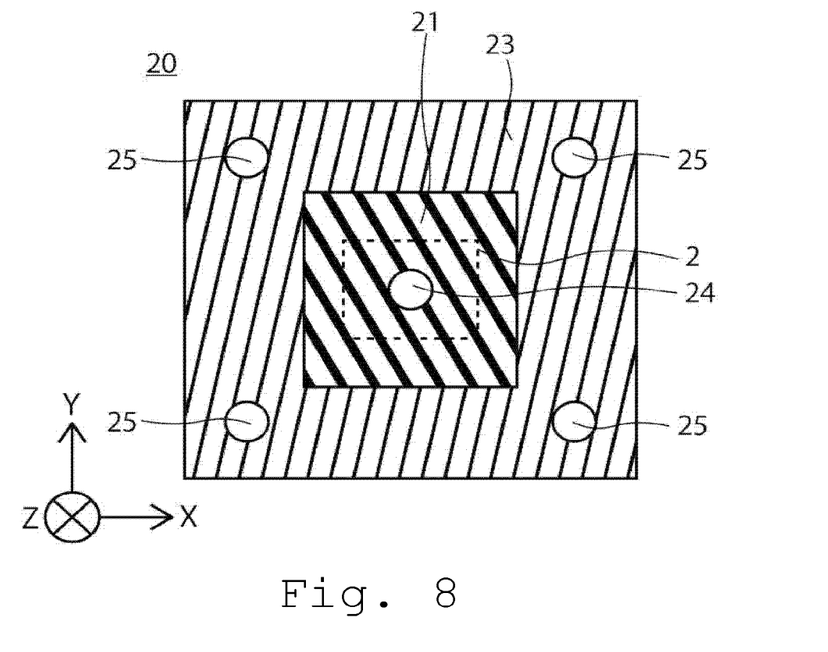
FIG. 8 is a schematic view of the surface that accommodates the member in which the plate-shaped member and the first adhesive layer of the collet according to the embodiment are stacked.
Figure 9:
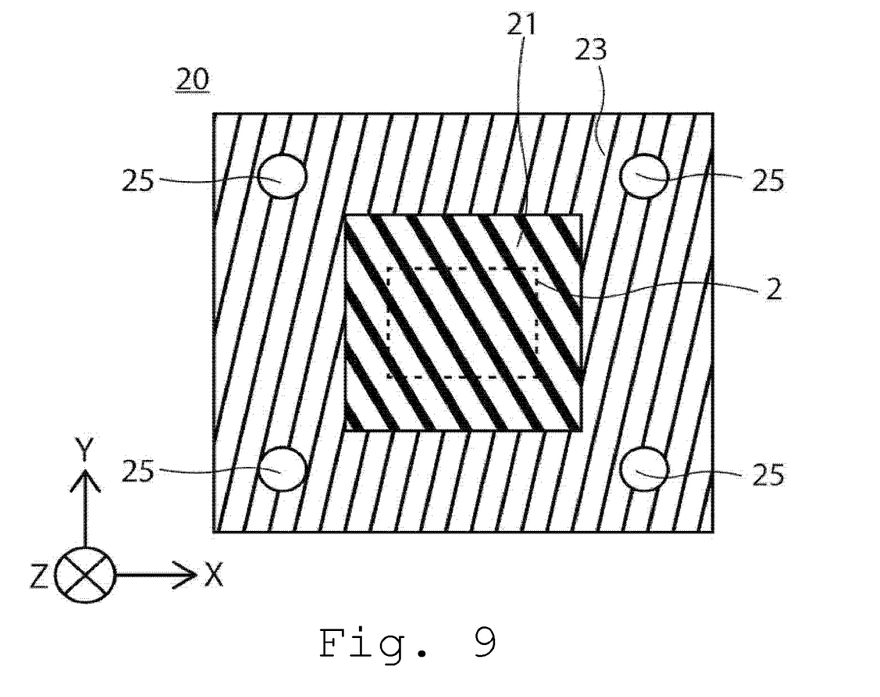
FIG. 9 is a schematic view of the surface that accommodates the member in which the plate-shaped member and the first adhesive layer of the collet according to the embodiment are stacked.

A position of the hole 24 of the collet 20 is not limited to the position illustrated in the schematic view of FIG. 7, and a plurality of examples of the position of the hole 24 of the collet 20 are illustrated in the schematic view of the surface of the collet 20 in FIGS. 8 and 9 that accommodates the member in which the plate-shaped member 6 and the first adhesive layer 5A are stacked. One hole 24 is provided in the first member 22 on the surface of the collet 20 illustrated in the schematic view of FIG. 8 that accommodates the member in which the plate-shaped member 6 and the first adhesive layer 5A are stacked, and a plurality of holes 25 are provided in the second member 23. The hole 24 is not provided in the first member 22 on the surface of the collet 20 illustrated in the schematic view of FIG. 9 that accommodates the member in which the plate-shaped member 6 and the first adhesive layer 5A are stacked, and the plurality of holes 25 are provided in the second member 23.

Figure 10:
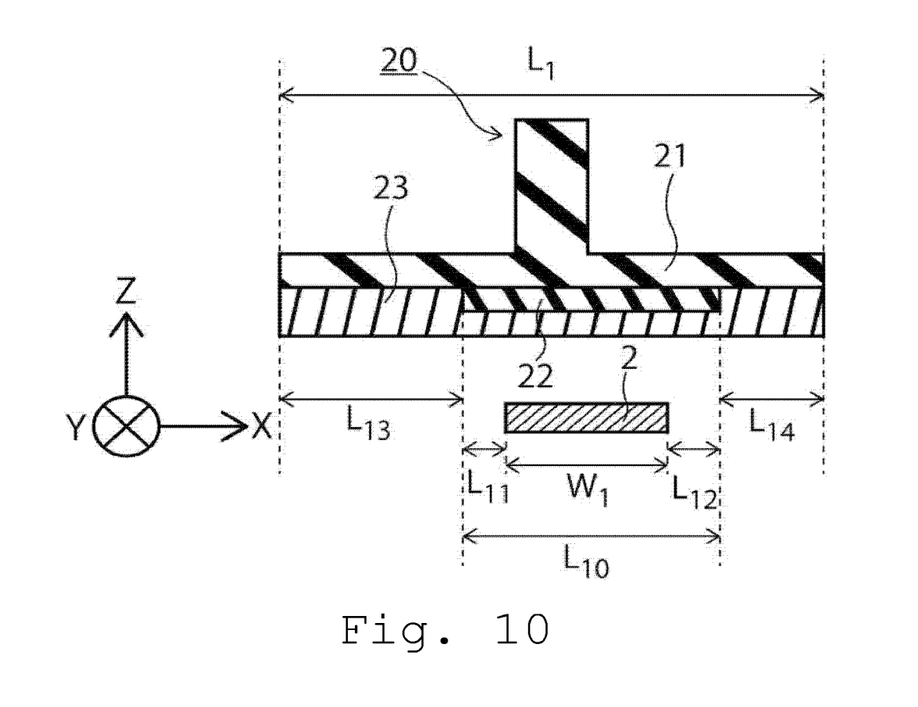
FIG. 10 is a schematic cross-sectional view illustrating the positional relationship between the collet and the first semiconductor element according to the embodiment.

As illustrated in a schematic cross-sectional view illustrating a positional relationship between the collet 20 and the first semiconductor element 2 of FIG. 10, the first member 22 and the second member 23 may be stacked in the Z direction. In a central portion of the collet holder 21, the collet holder 21, the first member 22, and the second member 23 are stacked in this order. A pressure for pressure-bonding the first adhesive layer 5A overlapping the first member 22 in the Z direction even when the first member 22 and the second member 23 are stacked is higher than a pressure for pressure-bonding the first adhesive layer 5A overlapping the second member 23 that is not stacked with the first member 22 in the Z direction, the flatness is good, and the occurrence of the bleed can be suppressed. In the schematic view of FIG. 10, the second member 23 is provided on the surface on the side accommodating the member in which the plate-shaped member 6 and the first adhesive layer 5A are stacked. However, a form in which the second member 23 is provided on the surface that accommodates the member in which the plate-shaped member 6 and the first adhesive layer 5A are stacked (the collet holder 21, the second member 23, and the first member 22 are stacked in this order) is used as a modification example of the collet 20 illustrated in the schematic view of FIG. 10. For example, a collet 20 in which two layers of the first members 22 are included and a collet holder 21, the first member 22, the second member 23, and the first member 22 are stacked in this order is included in the modification example of the collet 20. In the case of the collet 20 of the schematic cross-sectional view of FIG. 10, the boundary between the first member 22 and the second member 23 is not a stacking surface of the first member 22 and the second member 23, but is a boundary in an X-Y plane direction, that is, a boundary in a direction perpendicular to the pressure-bonding direction.

As illustrated in the schematic view of FIG. 10, the first member 22 may be provided at a position moved from the center of the collet holder 21 to the outer periphery. That is, the embodiment includes a form in which the center of the collet 20 does not coincide with the center of the first member 22 in the Z direction. At this time, a cross-sectional view in an X-Z plane direction satisfies a relationship of $L_{13} > L_{14}$. A cross-sectional view in a Y-Z plane direction satisfies a relationship of $L_2 < L_{24}$. In this form, when the first semiconductor element 2 and the collet 20 overlap in the Z direction which is the pressure-bonding direction of the board 1 and the first adhesive layer 5A described above, it is preferable that a relationship of the distance from the boundary between the first member 22 and the second member 23 to the first semiconductor element 2, a relationship of the distance from the outer periphery of the second member 23 to the boundary between the first member 22 and the second member 23, and the like are satisfied. A position of the first member 22 can be appropriately changed in accordance with the position and the shape of the first semiconductor element 2, and the manufacturing method according to the embodiment can be adopted without changing the position and the shape of the first semiconductor element 2.

The first member 22 can pressure-bond the first adhesive layer 5A on the first semiconductor element 2 by a strong pressure and the second member 23 can pressure-bond the first adhesive layer 5A of the outer periphery of the first semiconductor element 2 by a weak pressure by using such a collet 20. A large protrusion portion is not formed on the first adhesive layer 5A and the plate-shaped member 6 on the first semiconductor element 2, and the occurrence of the bleed can be suppressed.

Since the first semiconductor element 2 is a member having a small area, when the entire surface is pressure-bonded by a rubber collet, a small protrusion portion easily occurs at the central portion of the plate-shaped member 6. Since the second semiconductor element 7 is a thin member, the second semiconductor element is easily deformed by the protrusion portion, and the flatness of the semiconductor element excluding the first semiconductor element 2 in the semiconductor device 100 is easily greatly influenced. In order to avoid this, a method of using the thick member for the second adhesive layer 8A is exemplified, but the package size tends to be large. When the manufacturing method according to the embodiment is adopted, the height of the protrusion portion can be suppressed, and the flatness of the semiconductor element excluding the first semiconductor element 2 can be enhanced without increasing the package size.

Figure 11:
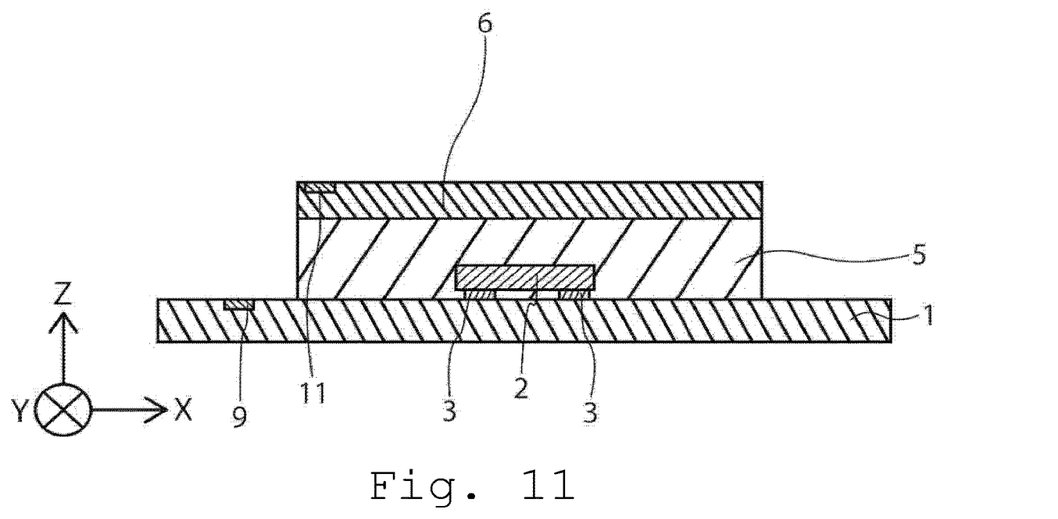
FIG. 11 is a process schematic cross-sectional view of the method for manufacturing a semiconductor device according to the embodiment.

Next, the step (S03) of curing the first adhesive layer 5A will be described with reference to a step cross-sectional view of FIG. 11. It is preferable that the first adhesive layer 5A is cured in a pressurizing oven without being pressurized by the collet 20. The cured first adhesive layer 5A becomes the first resin layer 5.

The temperature of the first adhesive layer 5A when the first adhesive layer 5A is cured is preferably equal to or more than 100 [° C.] and equal to or less than 200 [° C.], and more preferably equal to or more than 130 [° C.] and equal to or less than 180 [° C.].

A time during which the first adhesive layer 5A is cured is preferably equal to or more than 0.5 [hours] and equal to or less than 4.0 [hours], and more preferably equal to or more than 1.0 [hours] and equal to or less than 2.0 [hours].

It is preferable that a pressure of 10 M [Pa] or less is applied in a pressurizing oven at the time of curing.

Figure 12:
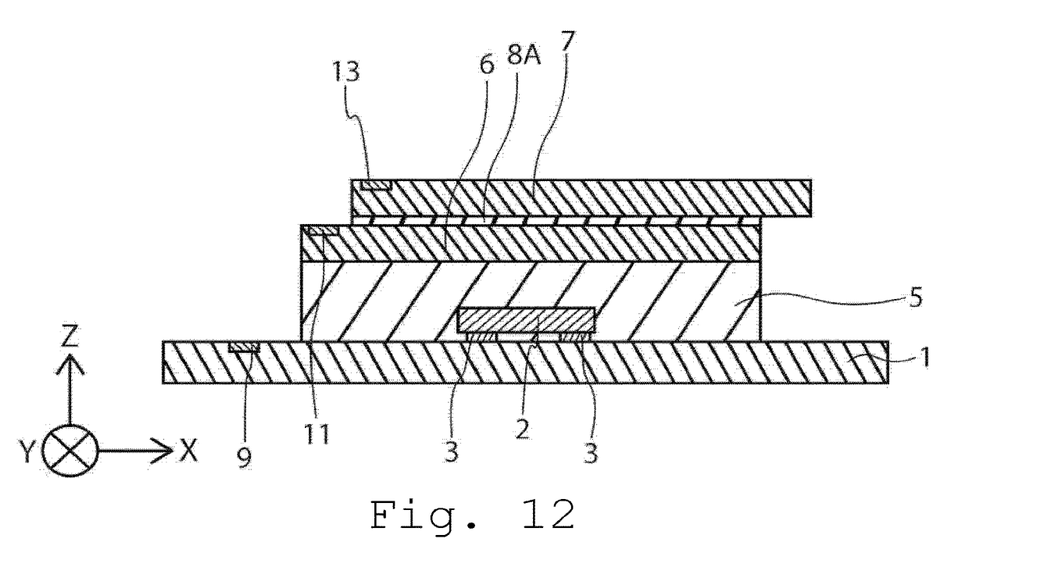
FIG. 12 is a process schematic cross-sectional view of the method for manufacturing a semiconductor device according to the embodiment.

Next, a step (S04) of providing the member in which the second adhesive layer 8A and the second semiconductor element 7 are stacked on the plate-shaped member 6 will be described with reference to a step cross-sectional view of FIG. 12. For example, the second adhesive layer 8A becomes the second resin layer 8 by accommodating the member in which the second adhesive layer 8A and the second semiconductor element 7 are stacked in the collet 20 according to the embodiment, pressure-bonding the member to the plate-shaped member 6, and then curing the second adhesive layer 8A. The collet used to accommodate the member in which the second adhesive layer 8A and the second semiconductor element 7 are stacked may be the same as or different from the collet 20 that accommodates the member in which the plate-shaped member 6 and the first adhesive layer 5A are stacked. When the plate-shaped member 6 is the third semiconductor element, it is preferable that the member is provided in which the second adhesive layer 8A and the second semiconductor element 7 are stacked on the plate-shaped member 6 is provided so as to be shifted in the direction (for example, in the X direction) perpendicular to the Z direction which is the pressure-bonding direction. When the plate-shaped member 6 is the Si layer or the insulating layer, it is preferable that the member is provided in which the second adhesive layer 8A and the second semiconductor element 7 are stacked on the plate-shaped member 6 without being shifted in the direction (for example, in the X direction) perpendicular to the Z direction which is the crimping direction.

Next, a step (S05) of forming the wiring electrically connecting the second semiconductor element 7 and the board 1 will be described. After the second semiconductor element 7 is formed on the plate-shaped member 6, the bonding wire 10 that connects the pad 9 of the board 1 and the pad 11 of the plate-shaped member 6, and the bonding wire 12 that connects the pad 11 of the plate-shaped member 6 and the pad 13 of the second semiconductor element 7 are formed. When the plate-shaped member 6 is the Si layer or the insulating layer, the pad 9 of the board 1 and the pad 13 of the second semiconductor element 7 are connected by a bonding wire (not illustrated).

Next, the step (S06) of forming the sealing material 14 will be described. After the bonding wires 10 and 12 are formed, the sealing material 14 is formed so as to cover all the members formed on the board 1. The solder ball 4 is formed to obtain the semiconductor device 100 of FIG. 1.

When the semiconductor device 100 is manufactured by the method described above, the flatness of the plate-shaped member 6 is improved. Here, the flatness and bleed of the plate-shaped member 6 are evaluated with reference to a partial schematic cross-sectional view of the semiconductor device of FIG. 13. The flatness is evaluated by an angle a. The angle a is an angle formed by a line segment passing through a point P1 positioned at a vertex of the central portion of the plate-shaped member 6 and a point P2 positioned at an end of the surface of the plate-shaped member 6 opposite to the board 1 and a line passing through a surface parallel to the surface of the board 1. When a height $L_3$ of a protrusion portion expressed by a distance between the point P1 and the point P2 in the Z direction increases, the flatness decreases and the angle a increases. The angle a is preferably equal to or more than 0.002 [°] and equal to or less than 0.017 [°]. From the same viewpoint, $L_3$ is preferably equal to or more than 0 [μm] and equal to or less than 50 [μm], and more preferably equal to or more than 0 [μm] and equal to or less than 25 [μm]. When the plate-shaped member 6 of the first stage on the first resin layer 5 has good flatness, the semiconductor elements stacked on the plate-shaped member 6 can be similarly stacked in a flat manner. When the angle a is large, the influence of the flatness increases as the number of semiconductor elements to be stacked increases, an inclination angle of the semiconductor elements increases, and it becomes difficult to stack many semiconductor elements. The flatness of the plate-shaped member 6 of the first stage is improved, and thus, when a large number of semiconductor elements are stacked, the semiconductor elements on an upper stage side can be stacked in a flat manner. A large number of semiconductor elements are stacked in a flat manner, and thus, the position of the semiconductor element on the upper stage side is lowered. Accordingly, the package size is reduced. Since the semiconductor element on the upper stage side also has good flatness, there is also an advantage that a variation in the distance from the upper surface of the sealing material 14 to the semiconductor element on the upper stage side is reduced and it is difficult to transmit damage when laser marking is performed on the sealing material 14 to the semiconductor element.

Figure 13:
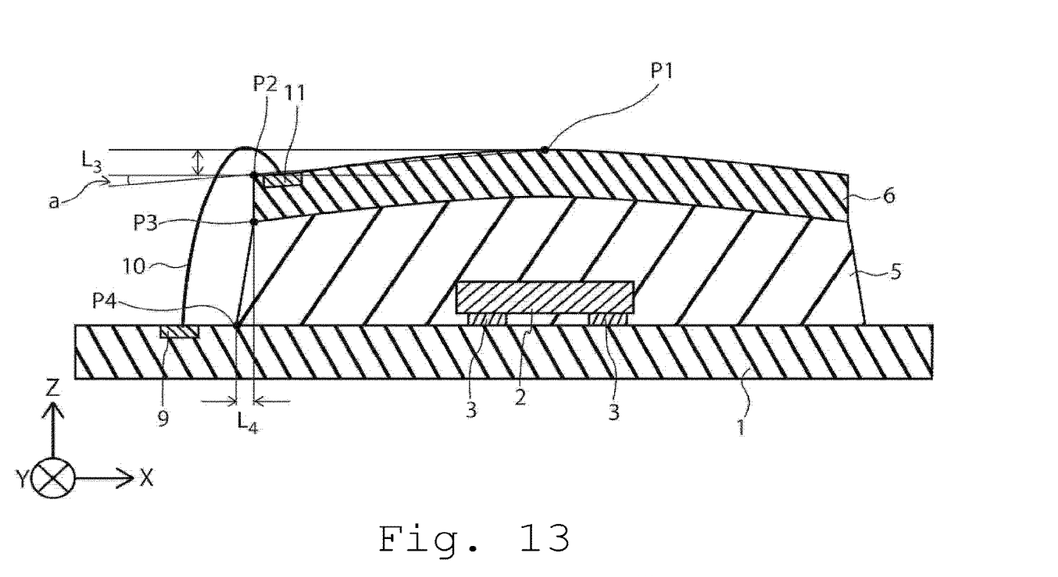
FIG. 13 is a partial schematic cross-sectional view of the semiconductor device according to the embodiment.

A width $L_4$ of the bleed is a distance from a point P3 to a point P4 in a plane direction of the board 1. The point P3 is positioned at an end of the surface of the plate-shaped member 6 close to the board 1. The point P4 is positioned at an end of the first resin layer 5 close to the board 1. When the width $L_4$ of the bleed increases, that is, the amount of bleed increases, there is an influence on a design such as shifting the position of the bonding wire 10. There are advantages that it is easy to design the wiring of the board 1 by reducing the amount of bleed and the package size can be reduced by providing the position of the bonding wire 10 on the center side.

Second Embodiment

Figure 14:
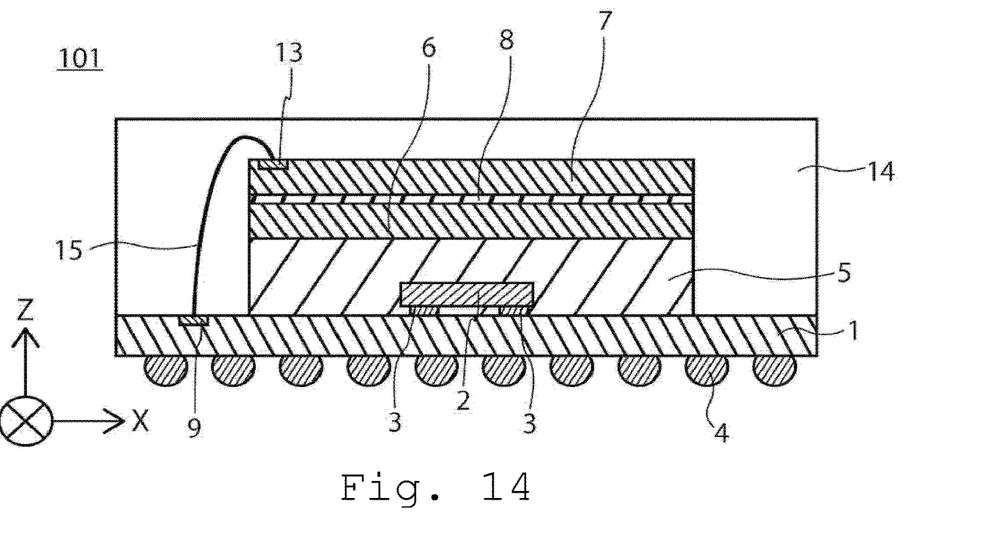
FIG. 14 is a schematic cross-sectional view of the semiconductor device according to the embodiment.

A second embodiment relates to a semiconductor device. The second embodiment is a modification example of the semiconductor device 100 according to the first embodiment. FIG. 14 is a schematic cross-sectional view of a semiconductor device 101 according to the second embodiment. The description of contents common to the second embodiment and the first embodiment will be omitted.

In the semiconductor device 101 according to the second embodiment, the plate-shaped member 6 is a Si layer or an insulating layer. Since the plate-shaped member 6 is the Si layer or the insulating layer, the bonding wire 10 that connects the plate-shaped member 6 and the board 1 and the bonding wire 12 that connects the plate-shaped member 6 and the second semiconductor element 7 are not included in the semiconductor device 101. Instead, a bonding wire 15 that connects the pad 9 of the board 1 and the pad 13 of the second semiconductor element is provided.

In the schematic view of FIG. 14, although the plate-shaped member 6 and the second semiconductor element 7 have the same size, the plate-shaped member 6 may have a larger area than the second semiconductor element 7, and the second semiconductor element 7 may be provided on the plate-shaped member 6 having a large area.

Third Embodiment

Figure 15:
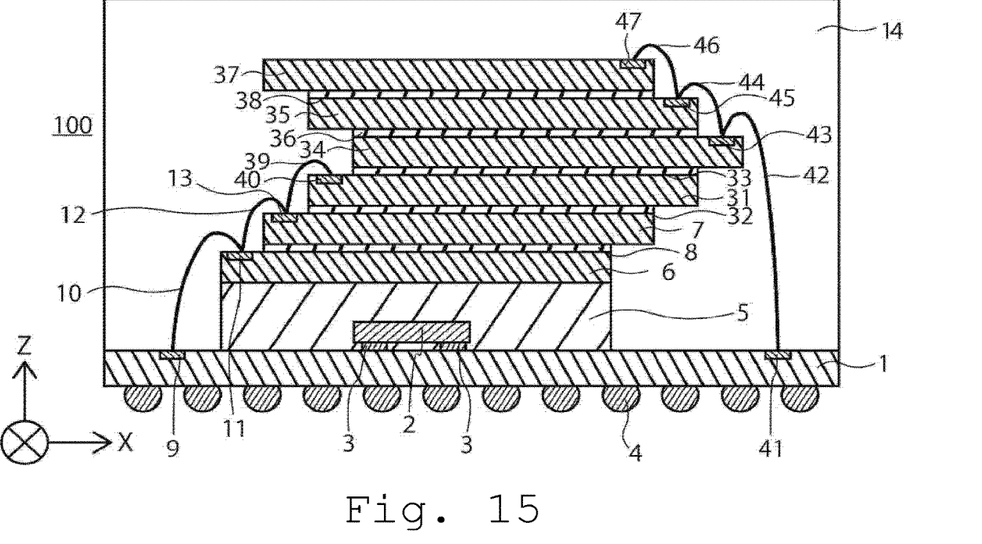
FIG. 15 is a schematic cross-sectional view of the semiconductor device according to the embodiment.

A third embodiment relates to a semiconductor device. The third embodiment is a modification example of the semiconductor device 100 according to the first embodiment. FIG. 15 is a schematic cross-sectional view of a semiconductor device 102 according to the third embodiment. The description of contents common to the third embodiment and the first embodiment will be omitted.

In the semiconductor device 102 according to the third embodiment, six layers of semiconductor elements are stacked. A fourth semiconductor element 31 is provided on the second semiconductor element 7. A fifth semiconductor element 34 is provided on the fourth semiconductor element 31. The fifth semiconductor element 34 is stacked so as to be shifted in a direction opposite to the fourth semiconductor element 31. A sixth semiconductor element 35 is provided on the fifth semiconductor element 34. A seventh semiconductor element 37 is provided on the sixth semiconductor element 35. A third resin layer 32 is provided between the second semiconductor element 7 and the fourth semiconductor element 31. The third resin layer 32 fixes the second semiconductor element 7 and the fourth semiconductor element 31. A fourth resin layer 33 is provided between the fourth semiconductor element 31 and the fifth semiconductor element 34. The fourth resin layer 33 fixes the fourth semiconductor element 31 and the fifth semiconductor element 34. A fifth resin layer 36 is provided between the fifth semiconductor element 34 and the sixth semiconductor element 35. The fifth resin layer 36 fixes the fifth semiconductor element 34 and the sixth semiconductor element 35. A sixth resin layer 38 is provided between the sixth semiconductor element 35 and the seventh semiconductor element 37. The sixth resin layer 38 fixes the sixth semiconductor element 35 and the seventh semiconductor element 37.

It is preferable that all the second semiconductor element 7, the plate-shaped member 6 (third semiconductor element), the fourth semiconductor element 31, the fifth semiconductor element 34, the sixth semiconductor element 35, and the seventh semiconductor element 37 included in the semiconductor device 102 are semiconductor chips having the same circuit and the same structure except for individual differences, and it is preferable that these components are semiconductor memory chips having the same circuit and the same structure except for individual differences.

The second semiconductor element 7, the plate-shaped member 6 (third semiconductor element), the fourth semiconductor element 31, the fifth semiconductor element 34, the sixth semiconductor element 35, and the seventh semiconductor element 37 included in the semiconductor device 102 have pads 11, 13, 40, 43, 45, and 47, respectively. The pads 11, 13, 40, 43, 45, and 47 of the second semiconductor element 7, the plate-shaped member 6 (third semiconductor element), fourth semiconductor element 31, the fifth semiconductor element 34, the sixth semiconductor element 35, and the seventh semiconductor element 37 are electrically connected to the board 1 and the first semiconductor element 2 via bonding wires 10, 12, 39, 42, 44, and 46.

Similarly to the second resin layer 8, the third resin layer 32, the fourth resin layer 33, the fifth resin layer 36, and the sixth resin layer 38 are obtained by curing the adhesive layer of the DAF.

When the number of stacked semiconductor elements is large as in the semiconductor device 102, the influence of the flatness of the lowermost plate-shaped member 6 greatly influences the flatness of the upper stage, but since the flatness of the lowermost plate-shaped member 6 is good, the upper stage side can also be stacked with good flatness.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method for manufacturing a semiconductor device, comprising:
    a step of mounting a first semiconductor element on a board; and
    a step of accommodating a stacked member comprising a plate-shaped member and a first adhesive layer stacked in a collet and pressure-bonding the heated first adhesive layer on the board on which the first semiconductor element is mounted,
    wherein the collet has a first member having a first Young's modulus and a second member having a second Young's modulus which is lower than the first Young's modulus on a surface that accommodates the stacked member.

2. The method according to claim 1, wherein, in the pressure-bonding step, a surface of the first member facing the first semiconductor element and a surface of the first semiconductor element facing the first member overlap in a pressure-bonding direction of the board and the first adhesive layer.

3. The method according to claim 1, wherein the second member is provided on an outer peripheral side of the first member.

4. The method according to claim 1, wherein an area of a surface of the first member facing the first semiconductor element is wider than an area of a surface of the first semiconductor element facing the first member.

5. The method according to claim 1, wherein, in the pressure-bonding step, an entire surface of the first member facing the first semiconductor element and an entire surface of the first semiconductor element facing the first member overlap in a Z direction which is a pressure-bonding direction of the board and the first adhesive layer.

6. The method according to claim 1, wherein the first Young's modulus is equal to or more than $2 \times 10^9$ [Pa] and equal to or less than $2 \times 10^{10}$ [Pa] in a range of 50 [C] or more to 150 [° C.] or less, and
    the second Young's modulus is equal to or more than $1 \times 10^7$ [Pa] and equal to or less than $2 \times 10^9$ [Pa] in a range of 50 [C] or more to 150 [° C.] or less.

7. The method according to claim 1, wherein a thermal conductivity of the first member is equal to or more than 1 [W/mK] and equal to or less than 100 [W/mK], and
    a thermal conductivity of the second member is equal to or more than 0.1 [W/mK] and equal to or less than 0.3 [W/mK].

8. The method according to claim 1, wherein the first Young's modulus in a range of 50 [° C.] or more to 150 [° C.] or less is equal to or more than 100 times and equal to or less than 20000 times of the second Young's modulus in a range of 50 [° C.] or more to 150 [° C.] or less.

9. The method according to claim 1, wherein a thermal conductivity of the first member is equal to or more than 3.3 times and equal to or less than 1000 times of a thermal conductivity of the second member.

10. The method according to claim 1, wherein, in the pressure-bonding step, an entire surface of the first member facing the first semiconductor element and an entire surface of the first semiconductor element facing the first member overlap in a pressure-bonding direction of the board and the first adhesive layer.

11. The method according to claim 10, wherein, when the first semiconductor element and the collet overlap in the pressure-bonding direction of the board and the first adhesive layer, a distance from a boundary between the first member and the second member to the first semiconductor element is equal to or more than 10 [μm] and equal to or less than 100 [μm].

12. The method according to claim 10, wherein a distance from an outer periphery of the second member to a boundary between the first member and the second member is equal to or more than 100 [μm] and equal to or less than 50000 [μm].

13. The method according to claim 1, wherein, the first member is one type of plate selected from the group consisting of a metal plate, a ceramic plate, and a rubber plate including a filler, or a stacked plate including one or more kinds of plate.

14. The method according to claim 1, wherein the second member is a rubber plate.

* * * * *